United States Patent [19]

Yamakoshi et al.

[11] 4,170,023
[45] Oct. 2, 1979

[54] CARRIER AGC CIRCUIT, ESPECIALLY BURST ACC AND APC

[75] Inventors: Akira Yamakoshi, Tokyo; Takao Tsuchiya, Fujisawa, both of Japan

[73] Assignee: Sony Corporation, Tokyo, Japan

[21] Appl. No.: 915,262

[22] Filed: Jun. 13, 1978

[30] Foreign Application Priority Data

Jun. 17, 1977 [JP] Japan .................... 52-71733

[51] Int. Cl.² ............... H04N 9/46; H04N 9/535; H03G 3/20
[52] U.S. Cl. ................. 358/19; 325/399; 325/408; 325/417; 358/27
[58] Field of Search .............. 358/19, 26, 27, 175; 325/399, 408, 409, 417

Primary Examiner—George G. Stellar

Attorney, Agent, or Firm—Lewis H. Eslinger; Alvin Sinderbrand

[57] ABSTRACT

A burst signal level detecting circuit for an automatic color control (ACC) circuit of a television receiver includes a band pass amplifier through which an input chrominance signal is supplied to a first and a second phase comparator via a burst gate. A subtracted output of the first and second phase comparators is supplied to a voltage controlled oscillator (VCO) and, the output of the VCO is supplied to the first phase comparator and through a phase shifter to the second phase comparator. An added output of the first and second phase comparators is supplied to the band pass amplifier as an ACC signal for controlling the gain of the band pass amplifier.

9 Claims, 7 Drawing Figures ($\theta_P = \theta_0 + \frac{\pi}{2}$)

($\theta_P = \theta_0 + \frac{\pi}{2} + \Delta\varphi$)

CARRIER AGC CIRCUIT, ESPECIALLY BURST ACC AND APC

BACKGROUND OF THE INVENTION

1. Field of the Invention

The present invention relates to an automatic color control circuit of a color television receiver, and more particularly to a burst signal level detecting circuit which is affected less by noise or the like than conventional color control circuits.

2. Description of the Prior Art

An automatic color control circuit (hereinafter referred to as an ACC circuit) of a prior art color television receiver is constructed as shown in the circuit of FIG. 1. In the circuit of FIG. 1, a color video signal is supplied to a band pass amplifier 1 to obtain amplified chrominance signal which is fed to a color demodulator 2. The chrominance signal from the band pass amplifier 1 is also supplied to a burst gate circuit 3 to create a burst signal Sb which is delivered to phase comparators (synchronous detectors) 4 and 6. The phase comparator 4 is also supplied with an oscillating signal So from a voltage controlled or variable frequency oscillator (hereinafter referred to as a VCO) 5, the free-running frequency of which is a carrier frequency. An output voltage Ec from the phase comparator 4 is fed to the VCO 5 as its control signal, thus forming an automatic phase control (APC) circuit 14. The phase of the oscillating signal So is locked by the burst signal Sb.

The signal So is also supplied to the color demodulator 2 so that red, green and blue color difference signals can be demodulated from the chrominance signal.

The oscillating signal So is also supplied to a phase shifter 7 which produces a signal Sp which is shifted in phase from oscillating signal So by $\pi/2$. This signal Sp is fed to a synchronous detector 6 which synchronously detects the burst signal Sb and which produces a DC voltage Ed having a level corresponding to that of the signal Sb. The voltage Ed is supplied to the band pass amplifier 1 as its gain control signal (ACC signal). In this manner, an ACC circuit 16 is formed and the level of the chrominance signal from the amplifier 1 is kept constant.

However, in the above ACC circuit 16, if an error exists in the amount in phase shift of the phase shifter 7, the level of the chrominance signal from the amplifier 1 will vary greatly when the phase of the oscillating signal So varies due to the influence of noise or the like. For example, in the phase comparator 4, with the phase of the burst signal Sb being taken as a reference, the relation between the phase $\theta$o of the signal So and the output voltage Ec is shown in the graph of FIG. 2A. Thus, the signal So is phase locked to a value of $\theta o = \pi/2$ at the stationary condition of Ec equal to zero. Also, in the synchronous detector 6, with the phase of the burst signal Sb being taken as a reference, the relation between the phase $\theta$p of the signal Sp and the output voltage Ed is shown in the graph of FIG. 2B. At the stationary condition thereof, the phase $\theta$p of the signal Sp from the phase shifter 7 is expressed as follows:

$$\theta p = \theta o + \pi/2 = \pi$$

Therefore, the voltage Ed, obtained from the synchronous detector 6, has a level at the trough or lowermost point on the curve of FIG. 2B corresponding to $\theta p = \pi$.

However, as shown in FIG. 2B when the phase $\theta$o of the signal So varies by $\Delta\theta$ due to the influence of noise or the like, the phase $\theta$p of the signal Sp will also vary by $\Delta\theta$, resulting in the level of the voltage Ed being changed by $\Delta E$.

The relationship between the ratio of level variation $\Delta E$ to phase variation $\Delta\theta$ and the phase $\theta$p is shown in FIG. 2C, where this relationship is equal to the first derivative of voltage Ed with respect to phase $\theta$p. In other words, when the phase $\theta$p of the signal Sp is equal to $\pi$, the variation $\Delta E$ of the voltage Ed is small, even though the phase $\theta$p is varied by $\Delta\theta$. However, when the phase $\theta$p of the signal Sp is varied by $\Delta\theta$ such that the phase $\theta$p is deviated from $\pi$, the variation $\Delta E$ of the voltage Ed will become large. Such a variation $\Delta E$ of the voltage Ed will result in a variation in the level of the chrominance signal.

Accordingly, to prevent large variations in the level of the chrominance signal, the phase shifter 7 is required to have a phase shift of $\pi/2$. If the phase shifter 7 does not have this value, the phase variation of the signal So will have a great effect on the level variation of the chrominance signal.

SUMMARY OF THE INVENTION

Accordingly, it is an object of this invention to provide a novel burst signal level detecting circuit free from the above-described drawbacks encountered with the prior art.

According to an aspect of this invention, a burst signal level detecting circuit for an automatic color control circuit of a television receiver has a video signal supplied thereto, through, for example, a band pass amplifier, to obtain an amplified chrominance signal which is supplied to a color demodulator and a burst gate, and the resulting burst signal from the latter is supplied as an input to first and second phase comparators. The outputs from the comparators are fed to an adder and a subtractor, with the output of the adder being supplied to the band pass amplifier as a gain control signal therefor. The output of the subtractor is supplied to a voltage controlled oscillator, the output of which is supplied as another input to the first phase comparator and to the second phase comparator through a phase shifter.

The above, and other objects, features and advantages of the present invention will be apparent from the following description of the illustrative embodiment of the invention which is to be read in conjunction with the accompanying drawings.

DESCRIPTION OF THE PREFERRED EMBODIMENT

Figure 1:
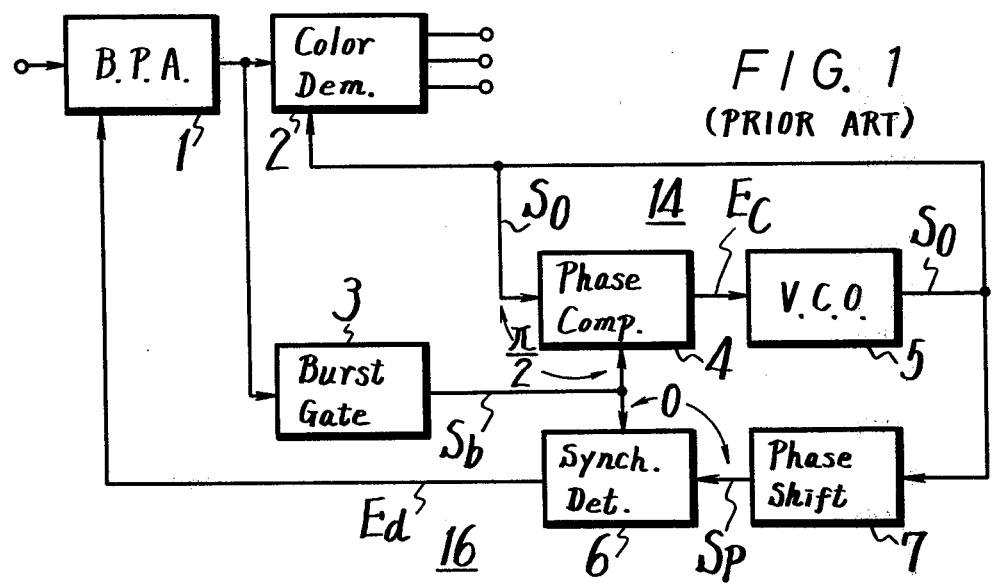
FIG. 1 is a circuit block diagram showing a prior art ACC circuit of a color television receiver.
Figure 2A:
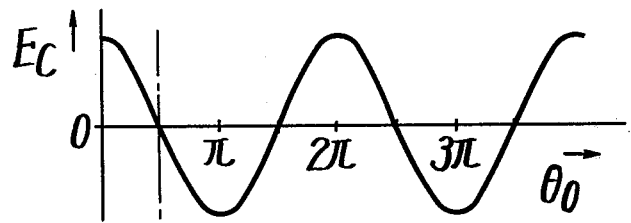
FIGS. 2A, 2B and 2C are waveform diagrams used for explaining the circuit of FIG. 1, and showing the relationships of Ec v. $\theta$o, Ed v. $\theta$p, and $\Delta E/\Delta\theta$ v. $\theta$p, respectively.
Figure 2B:
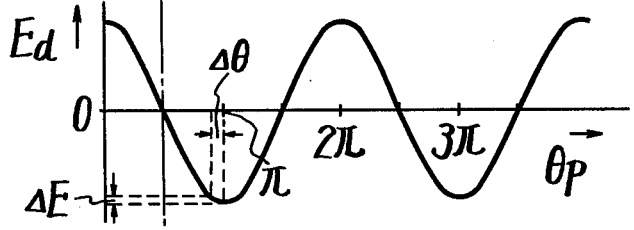
Figure 2C:
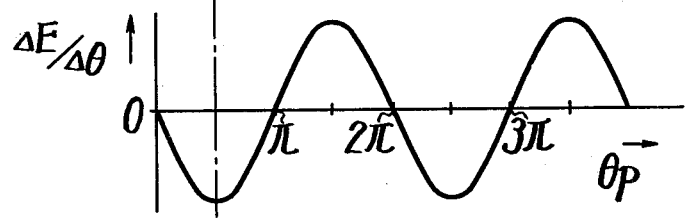

A description will hereinafter be given of one embodiment of this invention, with reference to FIG. 3, in which elements corresponding to those of FIG. 1 are shown by the same reference numerals with their description being omitted.

Figure 3:
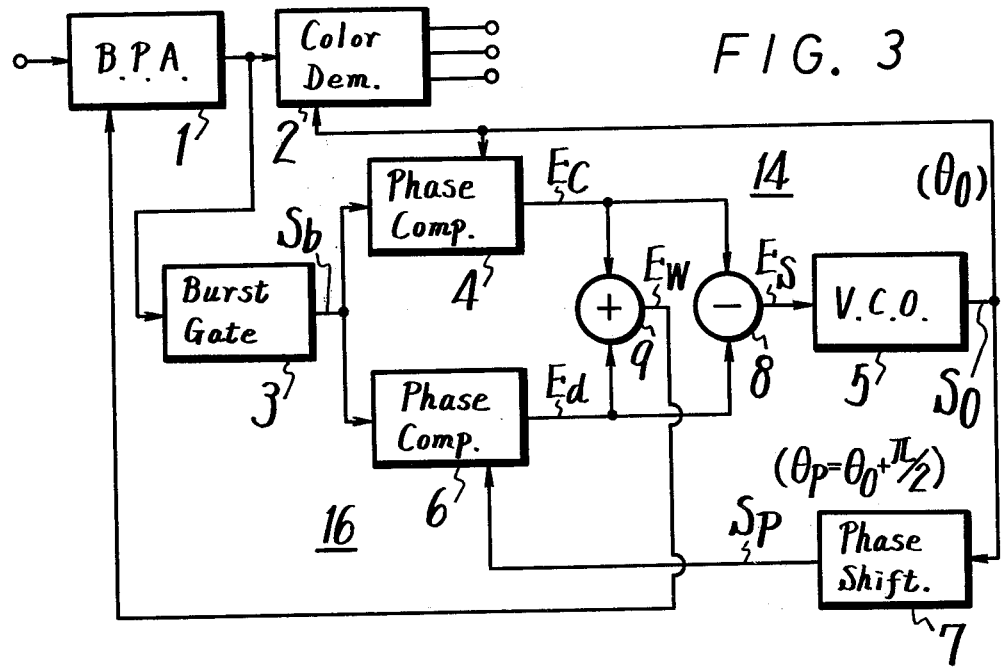
FIG. 3 is a circuit block diagram showing one embodiment of a burst signal level detecting circuit in accordance with this invention.

In FIG. 3, the burst signal Sb from the burst gate circuit 3 is supplied to the phase comparators 4 and 6, respectively, and the oscillating signal So from the VCO 5 is also fed to the phase comparator 4. The signal So from the VCO 5 is also supplied to the phase shifter 7 where it is shifted in phase by $\pi/2$ to obtain the signal Sp which is supplied to the phase comparator 6. Further, the output voltages Ec and Ed of the comparators 4 and 6 are respectively supplied to a subtractor 8 to obtain a subtracted voltage $Es = Ec - Ed$. This subtracted voltage Es is fed to the VCO 5 as its control voltage. The voltages Ec and Ed are also supplied to an adder 9 to obtain an added voltage $Ew = Ec + Ed$. This added voltage Ew is fed to the band pass amplifier 1 as its gain control signal.

Figure 4A:
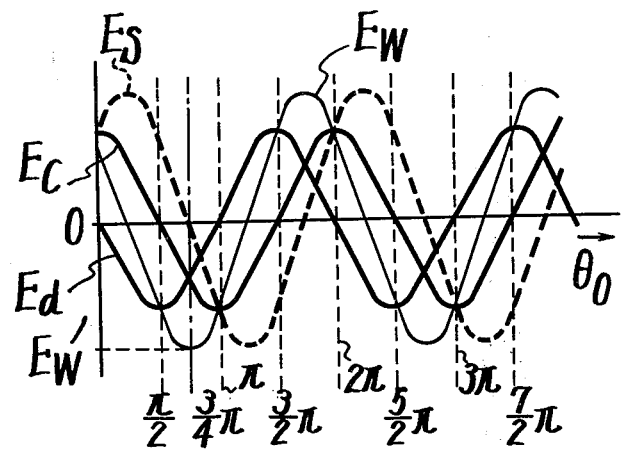
FIGS. 4A and 4B are waveform diagrams used for explaining the circuit of FIG. 3.

With the construction as described above, the output voltage Ec of the phase comparator 4 is varied according to the phase $\theta o$ of the signal So (the phase of the burst signal Sb being taken as a reference) as shown in FIG. 4A by a solid line. If the phase shift of the phase shifter 7 is assumed to be exactly $\pi/2$, the signal Sp from the phase shifter 7 is phase-shifted by $\pi/2$ relative to the signal So and hence the output voltage Ed of the phase comparator 6 is varied with respect to the phase $\theta o$ of the signal So, as shown in FIG. 4A by another solid line, which variation is deviated by $\pi/2$ from the variation of the voltage Ec.

As a result, the subtracted voltage Es is varied relative to the phase $\theta o$ of the signal So, as shown in FIG. 4A by a dotted line. This subtracted voltage Es is fed to the VCO 5 to control the phase or frequency of the oscillating signal So, and has a value of zero at the stationary condition thereof. Therefore, at this condition, the phase $\theta o$ of the signal So is locked to a value of $\frac{3}{4}\pi$.

The added voltage Ew varies with respect to the phase $\theta o$ of the signal So, as shown in FIG. 4A by a thin line, and the level at the lowermost point on the curve of Ew which corresponds to $\theta o = \frac{3}{4}\pi$, is taken as a voltage Ew'.

Figure 4B:
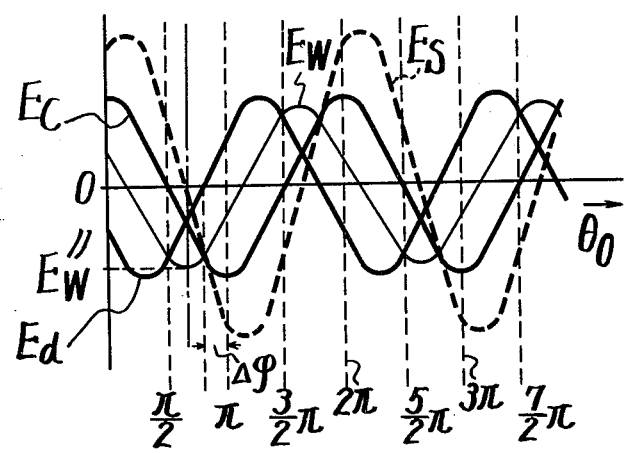

On the other hand, when the phase shift of the phase shifter 7 has an error $\Delta\phi$, the signal Sp from the phase shifter 7 will have a phase of $(\pi/2 + \Delta\phi)$ relative to the phase of the signal So from the VCO 5. In this case, when the voltage Es is zero, the added voltage Ew corresponds to the lowermost point on the curve of Ew, as shown in FIG. 4B. Since the phase $\theta o$ of the signal So is locked to a condition of Es = 0 under the stationary condition, the level at the trough or lowermost point at the stationary condition is given by a voltage Ew''.

At the trough point on the curve of the added voltage Ew, the variation of the added voltage Ew is at a minimum value relative to the variation $\Delta\theta$ of the phase $\theta o$ of the signal So from the VCO 5. Accordingly, even if the phase shift of the phase shifter 7 includes an error, the variation $\Delta\theta$ of the phase $\theta o$ of the signal So will not greatly effect the level variation of the added voltage Ew. Therefore, the level of the chrominance signal from the band pass amplifier 1 will be virtually unchanged due to the phase variation $\Delta\theta$. Further, for the same reason, even though the phase comparators 4 and 6 are not completely accurate, the level of the chrominance signal will not vary.

As mentioned above, according to this invention, even though the phase variation $\Delta\theta$ is present in the oscillating signal So of the VCO 5 due to the influence of noise or the like, the level of the chrominance signal will not vary much and hence, a stable color picture can be reproduced. In addition, this invention may be used with conventional circuits in existence, for example, adder 9 and the subtractor 8 may be added to the prior art circuit of FIG. 1. Further, if the phase comparator 6 can produce a reversely phased voltage —Ed, a phase inverting circuit is unnecessary in the subtractor 8. As a result, the burst signal level detecting circuit of this invention can be easily and economically constructed. The circuit may also be easily and economically constructed as an integrated circuit.

Having described a specific preferred embodiment of the invention with reference to the accompanying drawings, it is to be understood that the invention is not limited to the precise embodiment, and that various changes and modifications may be effected therein by one skilled in the art without departing from the scope or spirit of the invention as defined in the appended claims.

We claim as our invention:

1. A burst signal level detecting circuit for an automatic color control circuit of a television receiver, comprising:
    a first phase comparator having an output;
    a second phase comparator having output;
    means for supplying an input signal to said first and second comparators;
    subtracting means receiving said output of said first phase comparator and said output of said second phase comparator for producing an output corresponding to the difference between said outputs from said respective comparators;
    a variable frequency oscillator controlled by said output of said subtracting means and supplying an output thereof to said first phase comparator, so that said output of said first phase comparator corresponds to the phase relation of said output of said oscillator and said input signal;
    a phase shifter supplied with the output of said variable frequency oscillator and having a phase-shifted output signal thereof supplied to said second phase comparator, so that said output of said second phase comparator corresponds to the phase relation of said phase-shifted output signal and said input signal; and
    adding means supplied with the output of said first phase comparator and the output of said second phase comparator to produce an added output signal proportional to the level of said input signal.

2. A burst signal level detecting circuit according to claim 1; wherein said phase-shifted output signal is phase-shifted by $\pi12$ from said output of said variable frequency oscillator.

3. A burst signal level detecting circuit according to claim 1; wherein said means for supplying an input signal to said comparators includes a burst gate circuit for providing a burst signal as said input signal.

4. A burst signal level detecting circuit according to claim 3; including a band pass amplifier connected to the input of said burst gate circuit for supplying an amplified chrominance signal thereto, and wherein the level of said amplified chrominance signal does not substantially change due to variations in the phase of said output signal from said variable oscillator.

5. A burst signal level detecting circuit according to claim 4; wherein said output signal from said adding means is a voltage signal which is supplied to said band pass amplifier as a gain control signal therefor.

6. An automatic gain control circuit comprising:
a gain controlled amplifier supplied with an input signal having a predetermined carrier frequency and producing an amplified output signal corresponding to said input signal;
a first and a second phase comparator, each having a first and second input terminal and an output terminal having an output thereat;
means for supplying said amplified output signal from said gain controlled amplifier to the first terminals of said first and second phase comparators;
subtracting means connected to the output terminals of said first and second phase comparators for producing an output corresponding to the difference between said outputs from said respective comparators;
a variable oscillator controlled by said output of said subtracting means and having an output signal thereof supplied to the second input terminal of said first phase comparator, so that said first phase comparator provides said output thereof in correspondence to the phase relation of said output signal of said oscillator and said amplified output signal;
a phase shifter supplied with the output of said oscillator and having a phase-shifted output signal thereof supplied to the second input terminal of said second phase comparator, so that said second phase comparator provides said output thereof in correspondence to the phase relation of said phase-shifted output signal and said amplified output signal; and
adding means connected to the output terminals of said first and second phase comparators and having an added output which is supplied as a gain control signal to said gain controlled amplifier for producing a stable output signal of said amplifier.

7. An automatic gain control circuit according to claim 6; wherein said input signal is a chrominance signal and said gain controlled amplifier is a band pass amplifier.

8. An automatic gain control circuit according to claim 6; wherein said variable oscillator is a variable frequency oscillator.

9. An automatic gain control circuit according to claim 6; wherein said variable oscillator is a variable phase oscillator.

* * * * *